US009735395B2

(12) United States Patent
Wu et al.

(10) Patent No.: US 9,735,395 B2
(45) Date of Patent: Aug. 15, 2017

(54) ORGANIC LIGHT EMITTING DIODE DEVICE, MANUFACTURING METHOD THEREOF AND DISPLAY APPARATUS

(71) Applicants: BOE TECHNOLOGY GROUP CO., LTD., Beijing (CN); ORDOS YUANSHENG OPTOELECTRONICS CO., LTD., Ordos, Innter Mongolia (CN)

(72) Inventors: Haidong Wu, Beijing (CN); Weilin Lai, Beijing (CN); Qun Ma, Beijing (CN)

(73) Assignees: BOE TECHNOLOGY GROUP CO., LTD., Beijing (CN); ORDOS YUANSHENG OPTOELECTRONICS CO., LTD., Inner Mongolia (CN)

( * ) Notice: Subject to any disclaimer, the term of this patent is extended or adjusted under 35 U.S.C. 154(b) by 0 days.

(21) Appl. No.: 15/133,806

(22) Filed: Apr. 20, 2016

(65) Prior Publication Data

US 2017/0033318 A1    Feb. 2, 2017

(30) Foreign Application Priority Data

Jul. 27, 2015    (CN) .......................... 2015 1 0446946

(51) Int. Cl.
*H01L 51/52*    (2006.01)
*H01L 51/56*    (2006.01)
*H01L 51/00*    (2006.01)

(52) U.S. Cl.
CPC ........ *H01L 51/5271* (2013.01); *H01L 51/004* (2013.01); *H01L 51/005* (2013.01);
(Continued)

(58) Field of Classification Search
CPC ... H01L 51/005; H01L 51/5268; H01L 51/56; H01L 51/004; H01L 51/0096; H01L 51/5281; H01L 51/5271
See application file for complete search history.

(56) References Cited

U.S. PATENT DOCUMENTS

2004/0201346 A1* 10/2004 Pai ...................... H01L 51/5221
                                                          313/503
2005/0018431 A1*  1/2005 Shiang ................ H01L 51/5268
                                                          362/326
(Continued)

FOREIGN PATENT DOCUMENTS

CN    1711651 A    12/2005
CN    1753593 A    3/2006
(Continued)

OTHER PUBLICATIONS

First Office Action for CN Application No. 201510446946.5, dated Aug. 26, 2016 (14 pages).
(Continued)

*Primary Examiner* — Jarrett Stark
(74) *Attorney, Agent, or Firm* — Armstrong Teasdale LLP

(57) ABSTRACT

An organic light emitting diode (OLED) device includes a cathode, an anode and an organic function layer interposed between the cathode and the anode. A material of the cathode is at least one of a metal and a metal alloy. The light emitted from the organic function layer exits at least through the cathode. The organic light emitting diode device further includes an anti-reflective layer on a side of the cathode that faces away from the organic function layer. The anti-reflective layer includes a first surface and a second surface opposite to each other. The first surface contacts the cathode. External light reflected by the first surface and external light reflected by the second surface interfere destructively.

14 Claims, 3 Drawing Sheets

(52) U.S. Cl.
CPC ...... *H01L 51/0096* (2013.01); *H01L 51/5268* (2013.01); *H01L 51/5281* (2013.01); *H01L 51/56* (2013.01); *H01L 2251/303* (2013.01); *H01L 2251/5315* (2013.01); *H01L 2251/55* (2013.01); *H01L 2251/558* (2013.01)

(56) References Cited

U.S. PATENT DOCUMENTS

| | | | | |
|---|---|---|---|---|
| 2006/0232195 | A1* | 10/2006 | Cok | H01L 51/5268 313/504 |
| 2008/0239497 | A1 | 10/2008 | Lippey | |
| 2011/0042696 | A1* | 2/2011 | Smith | H01L 51/5265 257/89 |
| 2013/0105770 | A1* | 5/2013 | Pschenitzka | H01L 31/0232 257/40 |
| 2014/0111652 | A1* | 4/2014 | So | G01J 1/58 348/164 |
| 2015/0041780 | A1* | 2/2015 | Ma | H01L 51/0072 257/40 |

FOREIGN PATENT DOCUMENTS

| | | |
|---|---|---|
| CN | 1848478 B | 5/2010 |
| CN | 101957461 A | 1/2011 |
| CN | 101123838 B | 4/2012 |
| CN | 103050639 A | 4/2013 |
| CN | 103081112 A | 5/2013 |
| CN | 104183766 A | 12/2014 |
| KR | 1020140032819 A | 3/2014 |
| WO | 03005776 A1 | 1/2003 |

OTHER PUBLICATIONS

China Second Office Action, Application No. 201510446946.5, dated Jan. 24, 2017, 16 pages.

* cited by examiner

ORGANIC LIGHT EMITTING DIODE DEVICE, MANUFACTURING METHOD THEREOF AND DISPLAY APPARATUS

CROSS-REFERENCE TO RELATED APPLICATIONS

This application claims priority to Chinese Patent Application No. 201510446946.5, filed on Jul. 27, 2015, the entire disclosure of which is incorporated by reference herein as a part of this application.

BACKGROUND

The embodiments of present disclosure relate to an organic light emitting diode device, a manufacturing method thereof and a display apparatus.

Organic light emitting diode (OLED) device is an electroluminescent device formed of organic thin film, and has the advantages of simple fabrication process, low cost, easily forming a flexible structure, large view angle and the like. Therefore the display technology adopting the OLED has been an important display technology.

As shown in FIG. 1, a conventional OLED device comprises a cathode 1, an organic function layer 2 and an anode 3, and the cathode 1 is generally formed of metal or metal alloy. However, metal or metal alloy has high reflectivity with respect to the external light. When the light emitted from the organic function layer 2 exits through the cathode 1, the display brightness captured by human's eyes is the sum of the original display brightness and the brightness of the reflected external light. That is, there is a deviation in the display brightness of the OLED device, and thus the display effect of the OLED device is affected.

BRIEF DESCRIPTION

Embodiments of the present disclosure provide an organic light emitting diode device, a manufacturing method thereof and a display apparatus. When the light emitted from the organic function layer exits at least through the cathode, the organic light emitting diode device can reduce the deviation of the display brightness due to the fact that the cathode formed of metal or metal alloy reflects the external light.

In one aspect, an organic light emitting diode device is provided. The organic light emitting diode comprises a cathode, an anode and an organic function layer interposed between the cathode and the anode, wherein a material of the cathode is metal or metal alloy. Light emitted from the organic function layer exits at least through the cathode. The organic light emitting diode device further comprises an anti-reflective layer on a side of the cathode that faces away from the organic function layer, the anti-reflective layer comprising a first surface and a second surface opposite to each other, the first surface contacting the cathode. External light reflected by the first surface and external light reflected by the second surface interfere destructively.

In an exemplary embodiment, a material of the anti-reflective layer is an organic material which has scattering particles mixed therein.

In an exemplary embodiment, the scattering particles are silicon dioxide particles or titanium dioxide particles.

In an exemplary embodiment, the mass percent of the scattering particles in the organic material is in a range of 1%-5%.

In an exemplary embodiment, a particle size of the scattering particles is in a range of 40 nm-60 nm.

In an exemplary embodiment, the organic material is mainly composed of acrylic resin, isopropanol, acetone, trichlorethylene, polyvinyl acetate and polyvinyl alcohol, wherein the mass percent of the acrylic resin is in a range of 10%-40%, the mass percent of the isopropanol is in a range of 25%-29%, the mass percent of the acetone is in a range of 5%-20%, the mass percent of the trichlorethylene is in a range of 5%-20%, the mass percent of the polyvinyl acetate is in a range of 5%-20%, and the mass percent of the polyvinyl alcohol is in a range of 5%-20%.

In an exemplary embodiment, the transmittance of the anti-reflective layer is not less than 50%.

In an exemplary embodiment, the thickness of the anti-reflective layer is in a range of 110 nm-160 nm.

The present disclosure provides an organic light emitting diode device comprising a cathode, an anode and an organic function layer interposed between the cathode and the anode, material of the cathode being metal or metal alloy, light emitted from the organic function layer exiting at least through the cathode, wherein the organic light emitting diode device further comprises an anti-reflective layer on a side of the cathode that faces away from the organic function layer, the anti-reflective layer comprising a first surface and a second surface opposite to each other, the first surface contacting the cathode, and wherein external light reflected by the first surface and external light reflected by the second surface interfere destructively. In this way, when the external light is incident on the anti-reflective layer, it will be reflected by both the first and second surfaces of the anti-reflective layer, and the light reflected by the first surface of the anti-reflective layer and the light reflected by the second surface of the anti-reflective layer interfere destructively, which reduces the influence of the reflection of the external light on the light emitted from the organic function layer, and thus reduces the deviation of the display brightness due to the fact that the cathode formed of metal or metal alloy reflects the external light.

In another aspect, a display apparatus is provided which comprises any one of the organic light emitting diode devices as set forth above. The display apparatus may be a display device such as an OLED display and any product or component which has the display function and comprises the display device, such as a television, a digital camera, a cell phone, a tablet computer and the like.

In another aspect, a manufacturing method of an organic light emitting diode device is provided. The manufacturing method comprises forming a cathode, an anode and an organic function layer interposed between the cathode and the anode on a substrate, a material of the cathode being metal or metal alloy, wherein light emitted from the organic function layer exits at least through the cathode. The method also includes forming on the substrate an anti-reflective layer on a side of the cathode that faces away from the organic function layer, the anti-reflective layer comprising a first surface and a second surface opposite to each other, the first surface contacting the cathode, wherein external light reflected by the first surface and external light reflected by the second surface interfere destructively.

In an exemplary embodiment, the forming on the substrate an anti-reflective layer comprises:

forming the anti-reflective layer by spin-coating using an organic material, wherein the organic material has scattering particles mixed therein, as a coating solution, wherein the scattering particles are silicon dioxide particles or titanium dioxide particles, and the organic material is mainly composed of acrylic resin, isopropanol, acetone, trichlorethylene, polyvinyl acetate and polyvinyl alcohol, wherein in the organic material, the mass percent of the acrylic resin is in a range of 10%-40%, the mass percent of the isopropanol is in a range of 25%-29%, the mass percent of the acetone is in a range of 5%-20%, the mass percent of the trichlorethylene is in a range of 5%-20%, the mass percent of the polyvinyl acetate is in a range of 5%-20%, the mass percent of the polyvinyl alcohol is in a range of 5%-20%, and the mass percent of the silicon dioxide particles or the titanium dioxide particles is 1%-5%.

An embodiment of the present disclosure provides a manufacturing method of an organic light emitting diode device. The organic light emitting diode device manufactured by this method comprises a cathode, an anode and an organic function layer interposed between the cathode and the anode, the material of the cathode being metal or metal alloy, wherein light emitted from the organic function layer exits at least through the cathode, wherein the organic light emitting diode device further comprises an anti-reflective layer on a side of the cathode that faces away from the organic function layer, the anti-reflective layer comprising a first surface and a second surface opposite to each other, the first surface contacting the cathode, and wherein external light reflected by the first surface and external light reflected by the second surface interfere destructively. In this way, when the external light is incident on the anti-reflective layer, it will be reflected by both the first and second surfaces of the anti-reflective layer, and the light reflected by the first surface of the anti-reflective layer and the light reflected by the second surface of the anti-reflective layer interfere destructively, which reduces the influence of the reflection of the external light on the light emitted from the organic function layer, and thus reduces the deviation of the display brightness due to the fact that the cathode formed of metal or metal alloy reflects the external light.

BRIEF DESCRIPTION OF THE DRAWINGS

For the sake of describing the present disclosure more clearly, the accompanying drawings of the embodiments will be briefly introduced below, and obviously, the accompanying drawings described below merely relate to some embodiments of the present disclosure and are not a limitation to the present disclosure.

DETAILED DESCRIPTION

Figure 1:
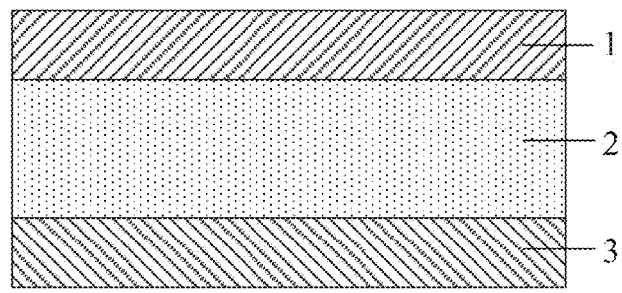
FIG. 1 is a structural schematic diagram of an OLED light emitting device provided by the prior art.

The present disclosure will be clearly and completely described hereinafter in conjunction with the accompanying drawings. Obviously, the described embodiments are only some of rather than all of the embodiments of the present disclosure. Other embodiments may be obtained by those skilled in the art based on the embodiments in the present disclosure without any creative work, and such other embodiments are within the scope claimed by the present disclosure.

In the description of the present disclosure, it shall be appreciated that the oriental or positional relationship indicated by the terms "upper", "lower" and the like is the oriental or positional relationship shown in the drawings, and such terms are used only for the purpose of description and simplifying the description rather than indicating or suggesting that the device or element indicated must be in a specific orientation, and/or structured and operated in a specific orientation. Such terms shall not be deemed to limit the scope of the present disclosure.

First Embodiment

Figure 2:
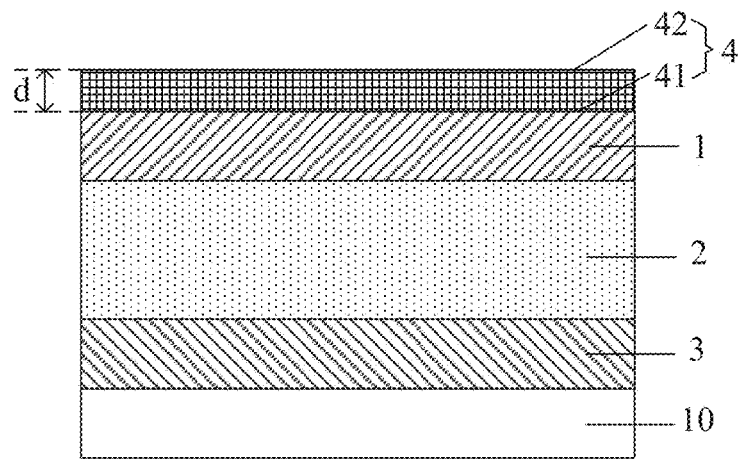
FIG. 2 is a structural schematic diagram of an organic light emitting diode device provided by an embodiment of the present disclosure.

This embodiment of the present disclosure provides an organic light emitting diode device. As shown in FIG. 2, the organic light emitting diode device comprises a cathode 1, an anode 3, and an organic function layer 2 interposed between the cathode 1 and the anode 3. A material of the cathode 1 is metal or metal alloy, and the light emitted from the organic function layer 2 exits at least through the cathode 1. The organic light emitting diode device further comprises an anti-reflective layer 4 on a side of the cathode 1 that faces away from the organic function layer 2. The anti-reflective layer 4 comprises a first surface 41 and a second surface 42 opposite to each other. The first surface 41 contacts the cathode 1. The external light reflected by the first surface and that reflected by the second surface can interfere destructively.

Figure 3:
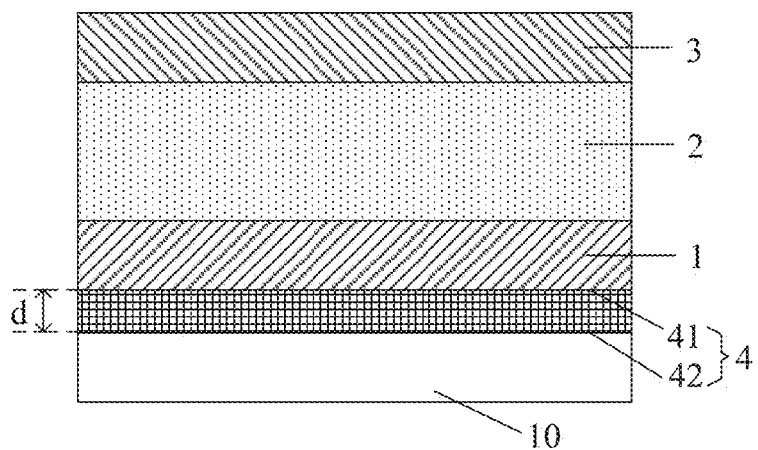
FIG. 3 is a structural schematic diagram of another organic light emitting diode device provided by an embodiment of the present disclosure.

There is no limitation on the relative positional relationship between the cathode and the anode in the above organic light emitting diode device of the embodiment of the present disclosure. For example, the cathode 1 may be located above the anode 3 as shown in FIG. 2. Alternatively, the cathode 1 may be located below the anode 3 as shown in FIG. 3. Furthermore, the anti-reflective layer is located on a side of the cathode that faces away from the organic function layer, that is, the anti-reflective layer may be located above the cathode as shown in FIG. 2 or below the cathode as shown in FIG. 3.

In the above organic light emitting diode device, the anti-reflective layer comprises the first surface and the opposed second surface opposite to each other. The first surface may be the lower surface as shown in FIG. 2 or the upper surface as shown in FIG. 3, and the second surface may be the upper surface as shown in FIG. 2 or the lower surface as shown in FIG. 3. The first and second surfaces are not particularly restricted as long as they are opposite to each other and the first surface contacts the cathode.

Figure 4:
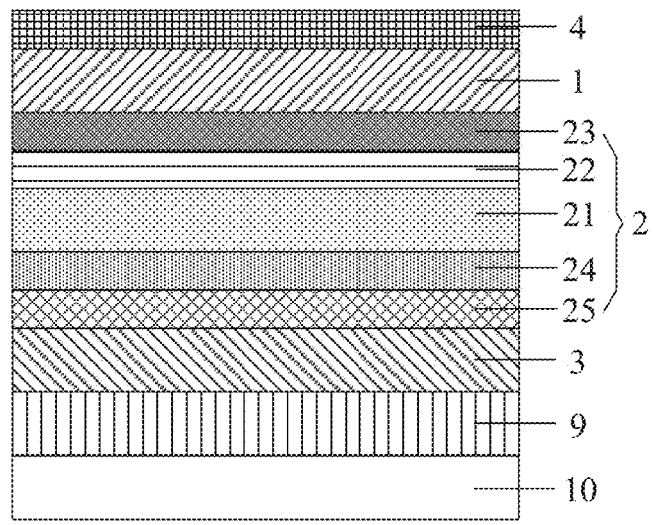
FIG. 4 is a structural schematic diagram of still another organic light emitting diode device provided by an embodiment of the present disclosure.

In the above organic light emitting diode device, the light emitted from the organic function layer exiting at least through the cathode may indicate that the light emitted from the organic function layer exits only through the cathode and thus a single-side light emitting device is formed, or that the light emitted from the organic function layer exits through both the cathode and the anode and thus a double-side device is formed. There is no limitation on this in the embodiment of the present disclosure. It is to be further noted that if the light emitted from the organic function layer 2 exits only through the cathode, a reflective layer 9 may be provided on a side of the anode 3 that faces away from the organic function layer 2 so as to prevent the light emitted from the organic function layer 2 exiting from the anode 3, as shown in FIG. 4.

The embodiment of the present disclosure does not put any limitation on the material of the anti-reflective layer in the organic light emitting diode device. For example, the material of the anti-reflective layer may be an inorganic material or an organic material. The embodiment of the present disclosure only gives a detailed description to the structure in an organic light emitting diode device that is critical to the explanation to one of ordinary skill in the art. It shall be appreciated by one skilled in the art that the organic function layer of the organic light emitting diode device may only comprise a light-emitting layer, or the organic function layer may further comprise other layers in order to improve luminous efficiency. For example, as shown in FIG. 4, the organic function layer 2 may further comprise an electron transporting layer 22, an electron injection layer 23, a hole transporting layer 24, a hole injection layer 25 and the like, in addition to the light-emitting layer. The present disclosure does not put any limitation on the organic function layer.

The embodiment of the present disclosure does not put any limitation on the material of the cathode in the above organic light emitting diode device. For example, the material of the cathode may be metal such as magnesium (Mg), silver (Ag), aluminum (Al), lithium (Li), potassium (K) or calcium (Ca), or metal alloy such as a magnesium-silver alloy ($Mg_xAg_{(1-x)}$), a lithium-aluminum alloy ($Li_xAl_{(1-x)}$), a lithium-calcium alloy ($Li_xCa_{(1-x)}$) or a lithium-silver alloy ($Li_xAg_{(1-x)}$). Furthermore, the embodiment of the present disclosure does not put any limitation on the material of the anode. The anode is commonly formed of ITO ($In_2O_3$:$SnO_2$, indium tin oxide) so as to facilitate the injection of holes into the organic function layer.

It is to be noted that the reduction of the reflection of the external light by the anti-reflective layer is based on the principle of destructive interference. Specifically, as shown in FIG. 5, when the external light 5 is perpendicularly incident on the anti-reflective layer 4, reflection occurs on both the first surface 41 and the second surface 42 of the anti-reflective layer 4. The difference between the distance traveled by the light 52 reflected by the second surface 42 of the anti-reflective layer 4 and that traveled by the light 51 reflected by the first surface 41 of the anti-reflective layer 4 is 2 d, and therefore the optical path difference between the light 51 reflected by the first surface 41 of the anti-reflective layer 4 and the light 52 reflected by the second surface 42 of the anti-reflective layer 4 is 2n*d. By adjusting the thickness d and the refractive index of the anti-reflective layer, the following equation can be satisfied:

$$2n*d=(m*\lambda)/2$$

where $\lambda$ is the wavelength of the light in vacuum, and m is a positive odd number. It can be known according to the light interference principle that the light 51 reflected by the first surface 41 of the anti-reflective layer 4 and the light 52 reflected by the second surface 42 of the anti-reflective layer 4 will destructively interfere, as shown in FIG. 5b. In this way, the anti-reflective layer can decrease the reflection of the external light when it is incident on the anti-reflective layer, thus can alleviate the impact of the reflection of the external light on the light emitted from the organic function layer, and thereby can reduce display brightness deviation due to the reflection of the external light by the cathode formed of metal or metal alloy.

Figure 5A:
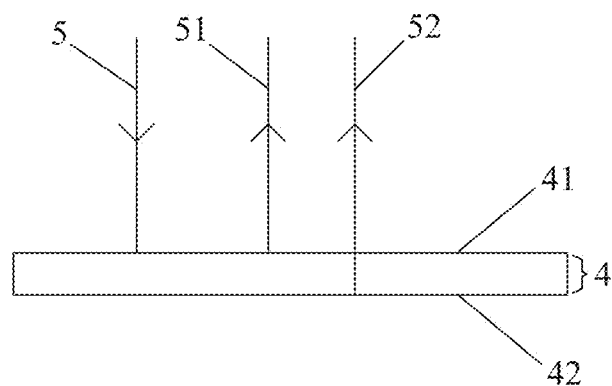
FIG. 5a is a schematic diagram of the reflection on the first and second surfaces of an anti-reflective layer when the external light is incident on the anti-reflective layer perpendicularly.
Figure 5B:
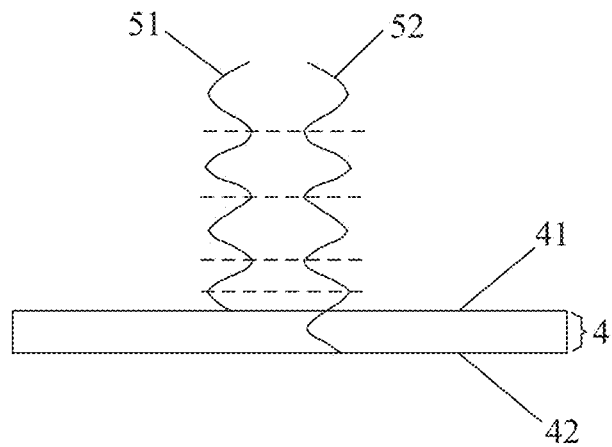
FIG. 5b is a schematic diagram of the respective light waves of the light reflected respectively by the first and second surfaces of the anti-reflective layer.

It is to be noted that the external light 5, the light 51 reflected by the first surface 41 of the anti-reflective layer 4 and the light 52 reflected by the second surface 42 of the anti-reflective layer 4 are drawn separately in FIG. 5a for the explanation. However, when the external light 5 is incident on the anti-reflective layer perpendicularly, the light 51 reflected by the first surface 41 of the anti-reflective layer 4 and the light 52 reflected by the second surface 42 of the anti-reflective layer 4 both exit in the opposite way to that of the external light 5. In other words, the external light 5, the light 51 reflected by the first surface 41 and the light 52 reflected by the second surface 42 shall be in a straight line. The same applies to FIG. 5b and repetition is omitted.

In an exemplary embodiment, the material of the above anti-reflective layer may be an organic material and scattering particles may be mixed in this organic material. In an exemplary embodiment, the organic material may be mainly composed of acrylic resin, isopropanol, acetone, trichloroethylene, polyvinyl acetate and polyvinyl alcohol. The scattering particles may be silicon dioxide particles or titanium dioxide particles. By mixing the scattering particles such as silicon dioxide particles or titanium dioxide particles in the anti-reflective layer, the light emitted from the organic light emitting diode device will be scattered when it is incident on the scattering particles. In this way, the emergent angle of the light is enlarged and the emergent light is more evenly distributed, which enlarges the view angle, decreases the occurrence rate of color cast and thereby improves the display effect. Meanwhile, since the anti-reflective layer is mainly composed of organic materials and the preparation of the organic materials is simple, the process difficulty is decreased.

In an exemplary embodiment, the mass percent of the scattering particles in the organic material is in a range of 1%-5%. For example, the mass percent of the scattering particles may be 1%, 2%, 3% or 5%. If the scattering particles are silicon dioxide particles, the mass percent of the silicon dioxide nanoparticles may be in a range of 1%-5%. For example, the mass percent of the silicon dioxide nanoparticles may be 1%, 2%, 3% or 5%. The mass percent of the titanium dioxide may be in a same range as that of the silicon dioxide nanoparticles, and the description thereof is omitted here.

In an exemplary embodiment, the mass percent of acrylic resin may be in a range of 10%-40%, the mass percent of isopropanol may be in a range of 25%-29%, the mass percent of acetone may be in a range of 5%-20%, the mass percent of trichloroethylene may be in a range of 5%-20%, the mass percent of polyvinyl acetate may be in a range of 5%-20%, and the mass percent of polyvinyl alcohol may be in a range of 5%-20%.

For example, the mass percent of acrylic resin may be 10%, 20%, 30% or 40%, the mass percent of isopropanol may be 25%, 26%, 27% or 29%, the mass percent of acetone may be 5%, 10%, 15% or 20%, the mass percent of trichloroethylene may be 5%, 10%, 15% or 20%, the mass percent of polyvinyl acetate may be 5%, 10%, 15% or 20%, and the mass percent of polyvinyl alcohol may be 5%, 10%, 15% or 20%.

In an exemplary embodiment, the particle size of the scattering particles mixed in the anti-reflective layer may be in a range of 40 nm-60 nm. For example, the particle size of the scattering particles may be 40 nm, 45 nm, 50 nm, 55 nm or 60 nm. If the scattering particles are silicon dioxide particles or titanium dioxide nanoparticles, the particle size of silicon dioxide nanoparticles or titanium dioxide nanoparticles may be in a range of 40 nm-60 nm. For example, the particle size of silicon dioxide nanoparticles or titanium dioxide nanoparticles may be 40 nm, 45 nm, 50 nm, 55 nm or 60 nm. Furthermore, the silicon dioxide nanoparticles or titanium dioxide nanoparticles may be solid or hollow, and the present disclosure does not put any limitation thereon.

In an exemplary embodiment, the transmittance of the anti-reflective layer is not less than 50% so as to neither affect the light emitted from the organic light emitting diode device nor decrease the display brightness of the organic light emitting diode device significantly.

In an exemplary embodiment, the thickness of the anti-reflective layer may be in a range of 110 nm-160 nm. For example, the thickness of the anti-reflective layer may be 110 nm, 120 nm, 130 nm, 140 nm, 150 nm or 160 nm.

Second Embodiment

This embodiment of the present disclosure provides a display apparatus comprising any organic light emitting diode device provided by the first embodiment. The display apparatus may be a display device such as an OLED (Organic Light-Emitting Diode) display and any product or component having the function of display that comprises the display device, such as a television, a digital camera, a cell phone, a tablet computer and the like.

Third Embodiment

This embodiment of the present disclosure provides a manufacturing method of an organic light emitting diode device which comprises the following steps S01 and S02.

S01: forming a cathode, an anode and an organic function layer, wherein the material of the cathode is metal or metal alloy, the organic function layer is interposed between the cathode and the anode, and the light emitted from the organic function layer exits at least through the cathode.

It is to be noted that, in step S01, a cathode 1, an organic function layer 2 and an anode 3 may be formed in this order on the substrate 10 so as to form the organic light emitting diode device shown in FIG. 3, or the anode 3, the organic function layer 2 and the cathode 1 may be formed in this order on the substrate 10 so as to form the organic light emitting diode device shown in FIG. 2. Either of the above circumstances is possible and the present disclosure does not put any limitation thereon.

S02: forming an anti-reflective layer on the substrate, wherein the anti-reflective layer is on a side of the cathode that faces away from the organic function layer, wherein the anti-reflective layer comprises a first surface and a second surface opposite to each other, the first surface contacts the cathode, and the external light reflected by the first surface and the external light reflected by the second surface can interfere destructively.

It is to be noted that the embodiment of the present disclosure does not put any limitation on the material of the anti-reflective layer in the present disclosure. For example, the material of the anti-reflective layer may be an inorganic material or an organic material.

It is to be further noted that the embodiment of the present disclosure does not put any limitation on the order of the step S01 and the step S02. If the organic light emitting diode device shown in FIG. 3 is formed by using the method, the step S02 will be performed before the step S01, i.e., the anti-reflective layer, the cathode, the organic function layer and the anode may be formed in this order on the substrate 10. On the other hand, if the organic light emitting diode device shown in FIG. 2 is formed by using the method, the step S01 will be performed before the step S02, i.e., the anode, the organic function layer, the cathode and the anti-reflective layer may be formed in this order on the substrate 10.

The embodiment of the present disclosure provides a manufacturing method of an organic light emitting diode device. The organic light emitting diode device manufactured by the method comprises a cathode, an anode and an organic function layer interposed between the cathode and the anode, wherein the material of the cathode is a metal or metal alloy, and the light emitted from the organic function layer exits at least through the cathode. The organic light emitting diode device further comprises an anti-reflective layer which is used for reducing the reflection of the external light and which is on a side of the cathode that faces away from the organic function layer. The anti-reflective layer comprises a first surface and a second surface opposite to each other. The external light reflected by the first surface and the external light reflected by the second surface can interfere destructively. Therefore, when the external light is incident on the anti-reflective layer, it will be reflected by both the first and second surfaces of the anti-reflective layer. The light reflected by the first surface of the anti-reflective layer and the light reflected by the second surface of the anti-reflective layer interfere destructively, which can alleviate the impact of the reflection of the external light on the light emitted from the organic function layer, and thereby can reduce display brightness deviation due to the reflection of the external light by the cathode formed of metal or metal alloy.

In an exemplary embodiment, the step S02, i.e., the forming on the substrate an anti-reflective layer may specifically comprise forming the anti-reflective layer by spin-coating using an organic material, which has scattering particles mixed therein, as coating solution.

In an exemplary embodiment, the above organic material may be mainly composed of acrylic resin, isopropanol, acetone, trichlorethylene, polyvinyl acetate and polyvinyl alcohol. The above scattering particles may be silicon dioxide particles or titanium dioxide particles. By mixing the scattering particles such as silicon dioxide particles or titanium dioxide particles in the anti-reflective layer, the light emitted from the organic light emitting diode device will be scattered when it is incident on the scattering particles. In this way, the emergent angle of the light is increased while the emergent light is more evenly distributed, which enlarges the view angle, decreases the occurrence rate of color cast and finally improves the display effect. Meanwhile, since the anti-reflective layer is mainly composed of organic materials and the preparation of the organic materials is simple, the process difficulty is decreased.

In an exemplary embodiment, the mass percent of the scattering particles in the organic material is in a range of 1%-5%. For example, the mass percent of the scattering particles may be 1%, 2%, 3% or 5%. If the scattering particles are silicon dioxide particles, the mass percent of the silicon dioxide nanoparticles may be in a range of 1%-5%. For example, the mass percent of the silicon dioxide nanoparticles may be 1%, 2%, 3% or 5%. The mass percent of the titanium dioxide may be in a same range as that of the silicon dioxide nanoparticles, and the description thereof is omitted here.

In an exemplary embodiment, in the organic material, the mass percent of acrylic resin may be in a range of 10%-40%, the mass percent of isopropanol may be in a range of 25%-29%, the mass percent of acetone may be in a range of 5%-20%, the mass percent of trichloroethylene may be in a range of 5%-20%, the mass percent of polyvinyl acetate may be in a range of 5%-20%, and the mass percent of polyvinyl alcohol may be in a range of 5%-20%.

For example, in the organic material, the mass percent of acrylic resin may be 10%, 20%, 30% or 40%, the mass percent of isopropanol may be 25%, 26%, 27% or 29%, the mass percent of acetone may be 5%, 10%, 15% or 20%, the mass percent of trichloroethylene may be 5%, 10%, 15% or 20%, the mass percent of polyvinyl acetate may be 5%, 10%, 15% or 20%, and the mass percent of polyvinyl alcohol may be 5%, 10%, 15% or 20%.

In an exemplary embodiment, the particle size of the scattering particles mixed in the anti-reflective layer may be in a range of 40 nm-60 nm. For example, the particle size of the scattering particles may be 40 nm, 45 nm, 50 nm, 55 nm or 60 nm. If the scattering particles are silicon dioxide particles or titanium dioxide nanoparticles, the particle size of silicon dioxide nanoparticles or titanium dioxide nanoparticles may be in a range of 40 nm-60 nm. For example, the particle size of silicon dioxide nanoparticles or titanium dioxide nanoparticles may be 40 nm, 45 nm, 50 nm, 55 nm or 60 nm. Furthermore, the silicon dioxide nanoparticles or titanium dioxide nanoparticles may be solid or hollow, and the present disclosure does not put any limitation thereon.

In an exemplary embodiment, the transmittance of the anti-reflective layer is not less than 50% so as to neither affect the light emitted from the organic light emitting diode device nor decrease the display brightness of the organic light emitting diode device significantly.

In an exemplary embodiment, the thickness of the anti-reflective layer may be in a range of 110 nm-160 nm. For example, the thickness of the anti-reflective layer may be 110 nm, 120 nm, 130 nm, 140 nm, 150 nm or 160 nm.

Figure 6:
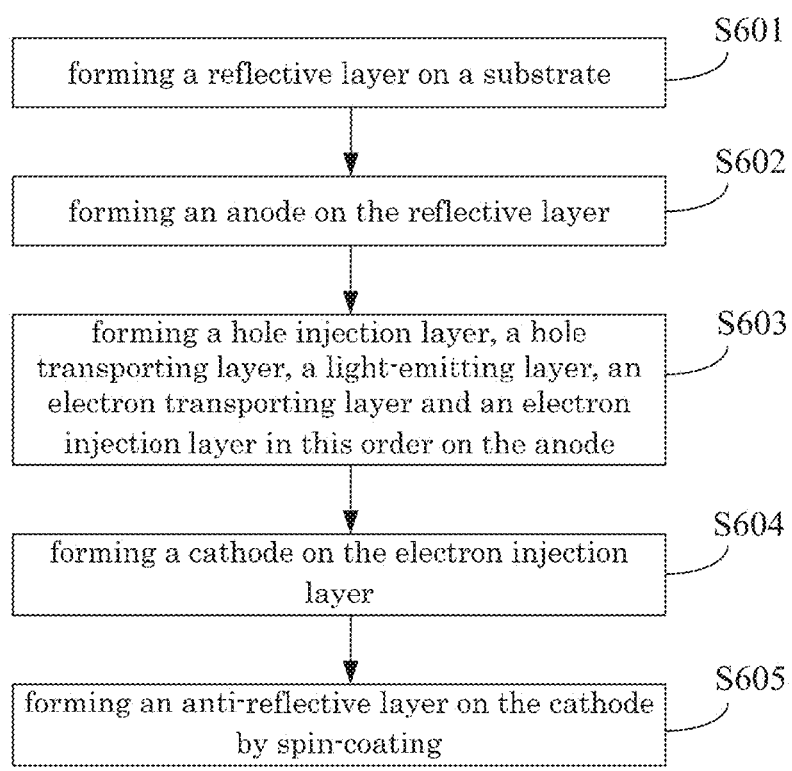
FIG. 6 is a flow chart of a method of manufacturing an organic light emitting diode device provided by an embodiment of the present disclosure.

The manufacturing method of an organic light emitting diode device provided by the embodiment of the present disclosure will be described in detail by taking the organic light emitting diode device shown in FIG. 4 as an example. As shown in FIG. 6, the method comprises the following steps.

S601: forming a reflective layer 9 on a substrate 10.

Specifically, the material of the reflective layer may be metal such as Ag, Al, Au, Cu or Mo, and the thickness of the reflective layer may be at least 80 nm.

S602: forming an anode 3 on the reflective layer 9.

Specifically, the material of the anode may be ITO ($In_2O_3$:$SnO_2$, indium tin oxide), IZO ($In_2O_3$:ZnO, indium zinc oxide), GITO($Ga_{0.08}In_{0.28}Sn_{0.64}O_3$, gallium indium tin oxide), ZITO($Zn_{0.64}In_{0.88}Sn_{0.66}O_3$, zinc indium tin oxide) or the like, and the thickness of the anode may be at least 10 nm.

S603: forming a hole injection layer 25, a hole transporting layer 24, a light emitting layer 21, an electron transporting layer 22 and an electron injection layer 23.

Specifically, the material of the hole injection layer may be 4,4',4'''-tris(N-(1-naphthyl)-N-phenylamino) triphenylamine (TNATA), copper phthalocyanine (CuPc), or the like.

The material of the hole transporting layer may be a material of which the hole mobility is high. For example, the material of the hole transporting layer may be N,N'-di(1-naphthyl)-N,N-diphenyl-1,1'-biphenyl-4-4'-diamine (NPB), triphenyl diamine derivative (TPD), TPTE, 1,3,5-tris(N-3-methylphenyl-N-phenylamino) benzene (TDAB) or the like.

The material of the light emitting layer commonly comprises a red, green, blue light emitting material or the like. For example, the red light emitting material may be (E)-4-dicyanomethylene-2-t-butyl-6-(1,1,7,7-tetramethyljulolidine ethenyl) pyran (DCJTB), Ir(piq)2(acac), Rubrene or the like. For example, the green light emitting material may be 2,3,6,7-tetrahydro-1,1,7,7-tetramethyl-1H,5H,11H-10-(2-benzothiazolyl)-quinolizino [9,9A,1GH] coumarin (C-545T), N,N'-dimethyl quinacridone, 5,12-dihydro-5,12-dimethylquino[2,3-b]acridine-7,14-dione (DMQA), diphenyl tin (DPT) and the like. For example, the blue light emitting material may be 9,10-di-2-naphthyl anthracene (ADN), dodecyl succinic anhydride (DSA), tributyl phosphine (TBP) and etc.

The material of the electron transporting layer may be a material of which the electron mobility is high. For example, the material of the electron transporting layer may be 2-(4-biphenylyl)-5-phenyloxadiazole (PBD), 2,5-bis(1-naphthyl)-1,3,5-oxadiazole (BND), 2,4,6-triphenoxyl-1,3,5-triazine (TRZ) and the like.

The material of the electronic injection layer may be lithium fluoride (LiF), lithium oxide ($Li_2O$), lithium boron oxide ($LiBO_2$), potassium silicate ($K_2SiO_3$), cesium carbonate ($Cs_2CO_3$), alkali metal acetates $CH_3COOM$ where M may be one of Li, Na, K, Rb and Cs, or the like.

S604: forming a cathode 1 on the electron injection layer 23.

Specifically, the material of the cathode may be metal such as Mg, Ag, Al, Li, K, Ca or the like, or metal alloy such as magnesium-silver alloy ($Mg_xAg_{(1-x)}$), lithium-aluminum alloy ($Li_xAl_{(1-x)}$) lithium-calcium alloy ($Li_xCa_{(1-x)}$) or lithium-silver alloy ($Li_xAg_{(1-x)}$).

S605: forming an anti-reflective layer 4 on the cathode 1 by spin-coating.

Specifically, the coating solution may be composed of 30% acrylic resin, 29% isopropanol, 10% acetone, 10% trichlorethylene, 10% polyvinyl acetate, 10% polyvinyl alcohol and 1% hollow silicon dioxide nanoparticles, wherein the hollow silicon dioxide nanoparticles have an average particle size of 60 nm.

As another option, the coating solution may be composed of 30% acrylic resin, 27% isopropanol, 10% acetone, 10% trichlorethylene, 10% polyvinyl acetate, 10% polyvinyl alcohol and 3% hollow silicon dioxide nanoparticles, wherein the hollow silicon dioxide nanoparticles have an average particle size of 50 nm.

As still another option, the coating solution may be composed of 30% acrylic resin, 25% isopropanol, 10% acetone, 10% trichlorethylene, 10% polyvinyl acetate, 10% polyvinyl alcohol and 5% hollow silicon dioxide nanoparticles, wherein the hollow silicon dioxide nanoparticles have an average particle size of 40 nm.

The above coating solution is applied on the cathode 1 by spin-coating so as to form the anti-reflective layer 4. The thickness of the anti-reflective layer 4 may be in a range of 110-160 nm. For example, the thickness of the anti-reflective layer may be 110 nm, 120 nm, 130 nm, 140 nm, 150 nm or 160 nm.

The description hereinbefore is only for the purpose of illustrating the embodiments of the present disclosure rather than limiting the scope of the present disclosure. Any variation or substitution that one skilled in the art may easily come up with according to the present disclosure shall fall into the scope of the present disclosure. Therefore, the scope of the present disclosure shall be defined by the appended claims.

What is claimed is:

1. An organic light emitting diode (OLED) device, comprising a cathode, an anode and an organic function layer interposed between the cathode and the anode, a material of the cathode being at least one of a metal and a metal alloy, wherein light emitted from the organic function layer exits at least through the cathode, wherein the organic light emitting diode device further comprises an anti-reflective layer on a side of the cathode that faces away from the organic function layer, the anti-reflective layer comprising a first surface and a second surface opposite to each other, the first surface contacting the cathode, and wherein external light reflected by the first surface and external light reflected by the second surface interfere destructively, wherein a material of the anti-reflective layer is an organic material which has scattering particles mixed therein, wherein the organic material comprises acrylic resin, isopropanol, acetone, trichlorethylene, polyvinyl acetate and polyvinyl alcohol, and in the organic material, the mass percent of the acrylic resin is in a range of 10%-40%, the mass percent of the isopropanol is in a range of 25%-29%, the mass percent of the acetone is in a range of 5%-20%, the mass percent of the trichlorethylene is in a range of 5%-20%, the mass percent of the polyvinyl acetate is in a range of 5%-20%, and the mass percent of the polyvinyl alcohol is in a range of 5%-20%.

2. The organic light emitting diode device according to claim 1, wherein the scattering particles comprise at least one of silicon dioxide particles and titanium dioxide particles.

3. The organic light emitting diode device according to claim 1, wherein the mass percent of the scattering particles in the organic material is in a range of 1%-5%.

4. The organic light emitting diode device according to claim 1, wherein the particle size of the scattering particles is in a range of 40 nm-60 nm.

5. The organic light emitting diode device according to claim 1, wherein the transmittance of the anti-reflective layer is not less than 50%.

6. The organic light emitting diode device according to claim 1, wherein the thickness of the anti-reflective layer is in a range of 110 nm-160 nm.

7. The organic light emitting diode device according to claim 1, wherein the thickness of the anti-reflective layer is in a range of 110 nm-160 nm.

8. The organic light emitting diode device according to claim 1, wherein the scattering particles comprise at least one of silicon dioxide particles and titanium dioxide particles, and wherein the thickness of the anti-reflective layer is in a range of 110 nm-160 nm.

9. A display apparatus, comprising the organic light emitting diode device according to claim 1.

10. A display apparatus, comprising the organic light emitting diode device according to claim 2.

11. A display apparatus, comprising the organic light emitting diode device according to claim 3.

12. A display apparatus, comprising the organic light emitting diode device according to claim 4.

13. A display apparatus, comprising the organic light emitting diode device according to claim 5.

14. A display apparatus, comprising the organic light emitting diode device according to claim 6.

* * * * *